United States Patent
Kato

(10) Patent No.: US 7,842,989 B2
(45) Date of Patent: Nov. 30, 2010

(54) SEMICONDUCTOR MEMORY CELL AND SEMICONDUCTOR MEMORY ARRAY USING THE SAME

(75) Inventor: Yoshihisa Kato, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/272,184

(22) Filed: Nov. 17, 2008

(65) Prior Publication Data
US 2009/0173978 A1   Jul. 9, 2009

(30) Foreign Application Priority Data
Jan. 9, 2008   (JP) ............................... 2008-002346

(51) Int. Cl.
*H01L 21/02* (2006.01)
(52) U.S. Cl. ............................... 257/295; 257/E27.104
(58) Field of Classification Search ................. 257/295, 257/401, E27.104, E29.17, E29.272, E29.275
See application file for complete search history.

(56) References Cited

U.S. PATENT DOCUMENTS

| | | | |
|---|---|---|---|
| 5,541,870 A * | 7/1996 | Mihara et al. ............... | 365/145 |
| 5,623,439 A | 4/1997 | Gotoh et al. | |
| 5,723,885 A | 3/1998 | Ooishi | |
| 5,903,492 A * | 5/1999 | Takashima .................. | 365/145 |
| 5,981,970 A * | 11/1999 | Dimitrakopoulos et al. ... | 257/40 |
| 6,252,248 B1 * | 6/2001 | Sano et al. ..................... | 257/59 |
| 6,344,660 B1 * | 2/2002 | Dimitrakopoulos et al. ... | 257/40 |
| 6,532,165 B1 | 3/2003 | Katori | |
| 7,005,302 B2 * | 2/2006 | Xiang .......................... | 438/3 |
| 7,187,575 B2 * | 3/2007 | Kijima et al. ............... | 365/145 |
| 2007/0063238 A1 | 3/2007 | Kaibara et al. | |
| 2008/0251816 A1 * | 10/2008 | Tanaka et al. ............... | 257/255 |
| 2009/0097299 A1 * | 4/2009 | Tanaka et al. ............... | 365/145 |

FOREIGN PATENT DOCUMENTS

JP   05-205487   8/1993

* cited by examiner

*Primary Examiner*—Minh-Loan T Tran
*Assistant Examiner*—Vongsavanh Sengdara
(74) *Attorney, Agent, or Firm*—McDermott Will & Emery LLP

(57) ABSTRACT

A memory element including a first FET, and a selection switch including a second FET are connected in series, and a semiconductor film and a dielectric film stacked over a substrate form a common channel and a common gate insulating film in the first and second FETs. A first gate electrode of the first FET and a second gate electrode of the second FET are formed on the dielectric film, and a drain electrode and a source electrode are formed on the semiconductor film. Under the semiconductor film, a back-gate electrode is formed with a ferroelectric film interposed therebetween, and the ends of the semiconductor film that forms the channel are located inwardly of the ends of the back-gate electrode.

12 Claims, 13 Drawing Sheets

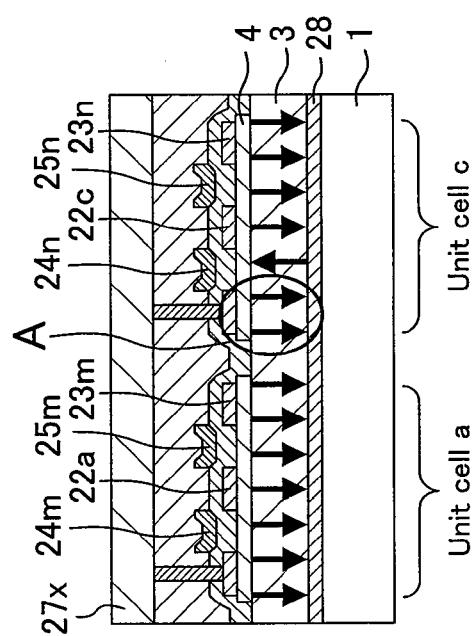
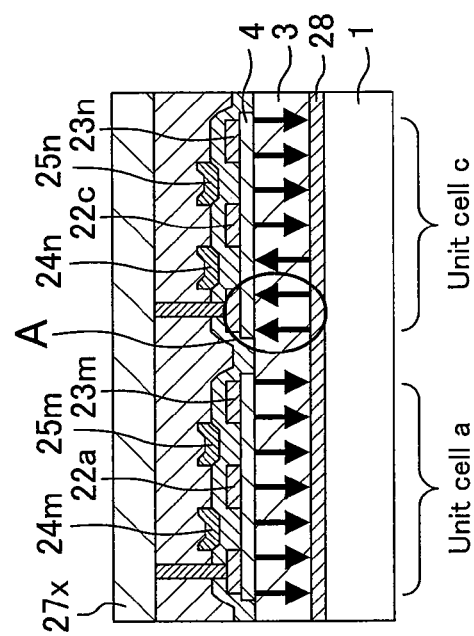
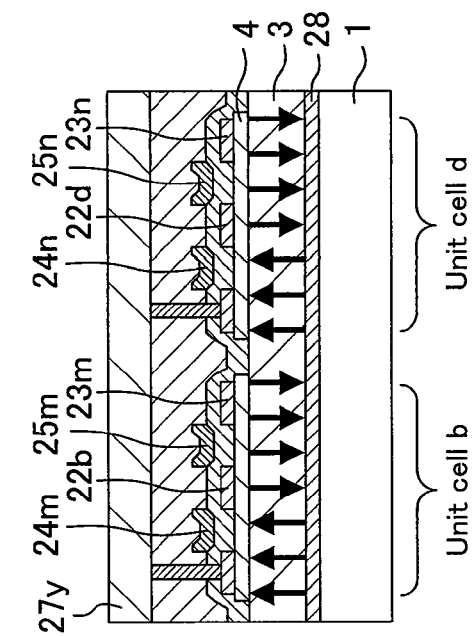
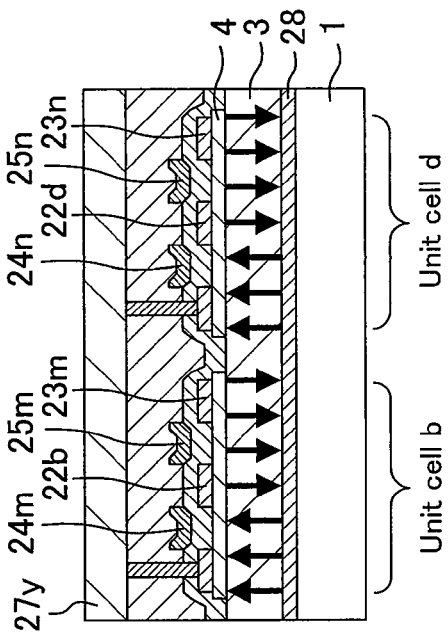
FIG. 11A
FIG. 11B

US 7,842,989 B2

SEMICONDUCTOR MEMORY CELL AND SEMICONDUCTOR MEMORY ARRAY USING THE SAME

BACKGROUND OF THE INVENTION

1. Field of the Invention

The present invention relates to a nonvolatile semiconductor memory cell utilizing channel resistance modulation in a semiconductor layer occurring due to remanent polarization of a ferroelectric material, and also relates to a semiconductor memory array using the nonvolatile semiconductor memory cell.

2. Description of the Related Art

Nonvolatile memories using ferroelectric materials are broadly divided into two types: a capacitor-type and a field effect transistor (FET)-type having a gate insulating film made of a ferroelectric film.

The capacitor-type nonvolatile ferroelectric memories, which are similar in structure to dynamic random access memories (DRAMs), hold charges in a ferroelectric capacitor therein and identify whether binary data is 0 or 1 according to the direction of polarization of the ferroelectric material. The polarization accumulated in the ferroelectric capacitor is coupled to charges induced by the upper and lower electrodes thereof and does not dissipate when the voltage is cut off. However, when the binary data is read, the stored polarization is destroyed and the binary data is lost. In this type, therefore, an operation for rewriting the binary data is needed. As a result, the rewriting operation performed in each read operation causes polarization reversal to be repeated so that polarization fatigue presents a problem. In addition, in this structure, since polarization charges are read by a sense amplifier, charges (typically 100 fC) equal to or higher than the sensing limit of the sense amplifier is necessary. The polarization charges per unit area of a ferroelectric material are intrinsic to the material. Hence, even in a miniaturized memory cell, an electrode area of a given size is needed as long as the same material is used. It is therefore difficult to reduce the capacitor size in direct proportion to the miniaturization of process rules, and the capacitor-type ferroelectric memories are thus unsuitable for an increase in capacity.

In contrast, from the FET-type ferroelectric memories, binary data is read by detecting the conductive state of the channel which changes in accordance with the direction of polarization of the ferroelectric film. This allows non-destructive reading of the binary data as well as an increase in the amplitude of an output voltage through the amplifying operation of the FET. As a result, the FET-type ferroelectric memories can be miniaturized in accordance with the scaling law. There has conventionally been proposed a FET-type transistor in which a ferroelectric film, serving as a gate insulating film, is formed on a silicon substrate serving as the channel. Such a structure is called a Metal-Ferroelectric-Semiconductor (MFS) FET.

In a memory cell array in which FET-type ferroelectric memories are arranged in a matrix with rows and columns, binary data is written into a ferroelectric memory by applying a voltage pulse between a gate electrode connected to a word line of the selected memory cell and a source electrode connected to a source line of the selected memory cell. However, when the voltage pulse is applied, the voltage is also applied to other memory cells which are connected to the word line and the source line of the selected memory cell and which are not to be accessed, resulting in error writing of the data, which is so-called "write disturbance". Thus, typically, a selection switch composed of a MISFET (Metal-Insulator-semiconductor FET), for example, is inserted between the word line and the gate electrode and/or between the source line and the source electrode, thereby preventing such an write disturbance. (see Japanese Laid-Open Publication No. 5-205487, for example)

SUMMARY OF THE INVENTION

Nevertheless, when a MFSFET serving as a memory element and a MISFET serving as a selection switch are placed side by side in order to prevent write disturbance, there must be at least an area for electrically separating the gate electrodes of these FETs, leading to the problem of increased cell size.

To address this, the present inventor proposed, in the specification of Japanese Application No. 2007-103754, a semiconductor memory cell having a smaller cell size and having a newly developed configuration including a FET-type memory element.

FIG. 14A is a cross-sectional view illustrating the configuration of the semiconductor memory cell disclosed in the above-mentioned specification, and FIG. 14B illustrates an equivalent circuit thereof.

As shown in FIG. 14A, a ferroelectric film 103 and a dielectric film 106 are stacked on a substrate 101 with a semiconductor film 104 interposed between the ferroelectric film 3 and the dielectric film 106. A first gate electrode 102 of a first field effect transistor is formed near the ferroelectric film 103, while a second gate electrode 107 of a second field effect transistor is formed close to the dielectric film 106. The semiconductor film 104 forms a common channel in the first and second field effect transistors. On the semiconductor film 104, a source electrode 105s and a drain electrode 105d which are common electrodes in the first and second field effect transistors are formed.

That is, this semiconductor memory cell has a structure in which a bottom-gate MFSFET (a memory element) and a top-gate MISFET (a selection switch) are stacked, and the equivalent circuit thereof has a configuration in which a MFSFET 111 and a MISFET 112 are connected in series.

In this semiconductor memory cell, data is written into the memory element in the following manner. A predetermined voltage is applied between the first gate electrode 102 and the drain electrode 105d with the selection switch turned on to thereby generate an electric field in the ferroelectric film 103. This electric field causes the polarization direction in the ferroelectric film 103 to be changed in an upward or downward direction, thereby writing the data into the memory element.

The data written into the memory element is read in the following manner. A predetermined voltage is applied to the second gate electrode 107 to turn the selection switch on, and a predetermined voltage is applied between the source electrode 105s and the drain electrode 105d to detect a current flowing through the channel (i.e., the semiconductor film 104) in accordance with the polarization state in the ferroelectric film 103, thereby reading the data.

In the semiconductor memory cell thus configured, since the first gate electrode 102 of the MFSFET serving as the memory element and the second gate electrode 107 of the MISFET serving as the selection switching element can be placed close to each other in a planar manner, the cell size is reduced. In addition, the multilayer structure in which the ferroelectric film 103 and the dielectric film 106 are stacked with the semiconductor film 104 interposed therebetween allows the interfaces between the semiconductor film 104 and the ferroelectric and dielectric films 103 and 106 to be in a good condition. As a result, the semiconductor memory cell with a further improved retention characteristic can be obtained.

However, when the present inventor prototyped a semiconductor memory cell having the configuration described above and evaluated the characteristics thereof, he found that the semiconductor memory cell has the following problem.

Specifically, as shown in FIG. 14A, the multilayer film composed of the ferroelectric film 103 and the semiconductor film 104 is formed on the substrate 101 having the first gate electrode 102 formed on the surface thereof. Thus, if the semiconductor film 104 is stacked on the ferroelectric film 103 while the step formed by the first gate electrode 102 remains without being diminished by the ferroelectric film 103, part of the channel formed by the semiconductor film 104 located on that step will have a high resistance.

Also, the first gate electrode 102 is formed by dry etching of a conductive film using a patterned resist film as a mask. During the etching process, reaction products may adhere to the side walls of the resist film, and even if the resist film is removed after the completion of the etching process, these reaction products may adhere and remain on the substrate 101 without being removed. In this condition, if the ferroelectric film 103 and the semiconductor film 104 are formed on the substrate 101, and if there is a step, caused by the reaction products, on the surface of the ferroelectric film 103, part of the channel formed by the semiconductor film 104 located on that step may again have a high resistance.

In view of these problems, the present invention has been made, and it is therefore the main object of the present invention to provide a semiconductor memory cell having stable characteristics, and a high-density semiconductor memory array using the semiconductor memory cell.

An inventive semiconductor memory cell includes a memory element including a first field effect transistor and a selection switch including a second field effect transistor, the memory element and the selection switch being connected in series. In the inventive semiconductor memory cell, a semiconductor film and a dielectric film stacked over a substrate form a common channel and a common gate insulating film in the first and second field effect transistors; a first gate electrode of the first field effect transistor and a second gate electrode of the second field effect transistor are formed on the dielectric film; on the semiconductor film, a drain electrode is formed outwardly of the first gate electrode, and a source electrode is formed outwardly of the second gate electrode; under the semiconductor film, a back-gate electrode is formed with a ferroelectric film interposed therebetween; and ends of the semiconductor film that forms the channel are located inwardly of ends of the back-gate electrode.

In this configuration, since the channel region made of the semiconductor film is formed over the back-gate electrode which is larger than the channel region, the channel region is composed of the smooth semiconductor film having no steps. This allows the semiconductor memory cell to have stable characteristics.

In addition, when semiconductor memory cells thus configured are arranged in an array to form a semiconductor memory array, the back-gate electrode can also be used as a common electrode in the semiconductor memory cells. It is thus possible to achieve a high-density semiconductor memory array.

In one embodiment, a part of the ferroelectric film located under the first gate electrode is polarized in a first direction, and a part of the ferroelectric film located under the second gate electrode is polarized in a second direction which is opposite to the first direction, thereby resetting the semiconductor memory cell so that a part of the channel located under the first gate electrode has a low resistance and a part of the channel located under the second gate electrode has a high resistance.

In another embodiment, a predetermined voltage is applied to the back-gate electrode to polarize the entire ferroelectric film in the first direction, and then a predetermined voltage is applied to the second gate electrode to polarize only the part of the ferroelectric film located under the second gate electrode in the second direction, thereby performing the reset operation.

In still another embodiment, a predetermined voltage is applied to the back-gate electrode and between the first gate electrode and the drain electrode to polarize a part of the ferroelectric film located under the first gate electrode in a second direction which is opposite to a reset state, thereby writing data into the first field effect transistor.

In yet another embodiment, a predetermined voltage is applied to the second gate electrode to turn the second field effect transistor on, and a predetermined voltage is applied between the source electrode and the drain electrode to detect a current that flows in accordance with a polarization direction in a part of the ferroelectric film located under the first gate electrode, thereby reading data written into the first field effect transistor.

In an inventive semiconductor memory array, in which a plurality of the above-described semiconductor memory cells are arranged in an array, in the semiconductor memory cells, the first gate electrodes in each row are connected to a corresponding one of first word lines, the second gate electrodes in each row are connected to a corresponding one of second word lines, the source electrodes in each row are connected to a corresponding one of source lines, the drain electrodes in each column are connected to a corresponding one of bit lines, and the back-gate electrode is a common electrode in all of the semiconductor memory cells.

In one embodiment, a predetermined voltage is applied to the back-gate electrode to polarize, in a first direction, the entire ferroelectric film in all of the semiconductor memory cells, and then a predetermined voltage is applied between all of the second word lines and all of the source lines to polarize, in a second direction, only parts of the ferroelectric film located under the second gate electrodes in all of the semiconductor memory cells, thereby performing a reset operation.

In another embodiment, a predetermined voltage is applied between the back-gate electrode and the first word line in a selected row, and a predetermined voltage corresponding to data to be written is applied to each bit line, thereby writing the data into the first field effect transistor in each semiconductor memory cell in the selected row.

In still another embodiment, a predetermined voltage is applied to the second word line in a selected row, and a predetermined voltage is applied to each bit line to detect a current that flows in the source line in the selected row, thereby reading data written into each semiconductor memory cell in the selected row.

BRIEF DESCRIPTION OF THE DRAWINGS

FIGS. 11A and 11B are cross-sectional views for explaining the write operation in the semiconductor memory array according to the second embodiment of the invention.

FIG. 14A is a cross-sectional view, and FIG. 14B is an equivalent circuit diagram.

DETAILED DESCRIPTION OF THE INVENTION

Figure 1:
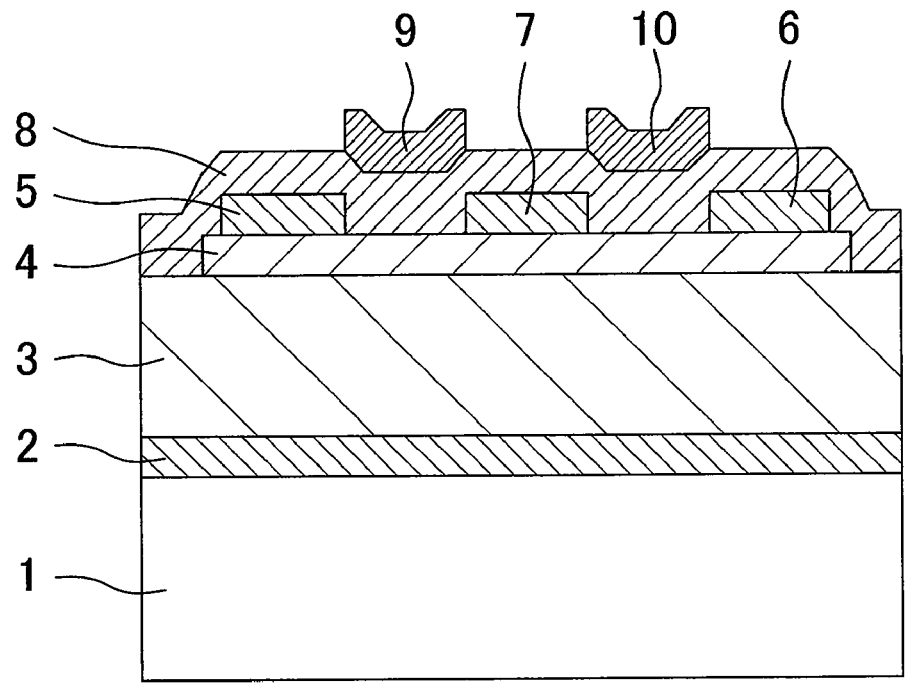
FIG. 1 is a cross-sectional view illustrating the configuration of a semiconductor memory cell according to a first embodiment of the invention.

Referring to the drawings, the embodiments of the present invention will be described hereinbelow. In the drawings, for the sake of simplicity, components having substantially the same functions will be denoted by the same reference numerals. It is to be noted that the present invention is not limited to the following embodiments.

First Embodiment

Figure 2:
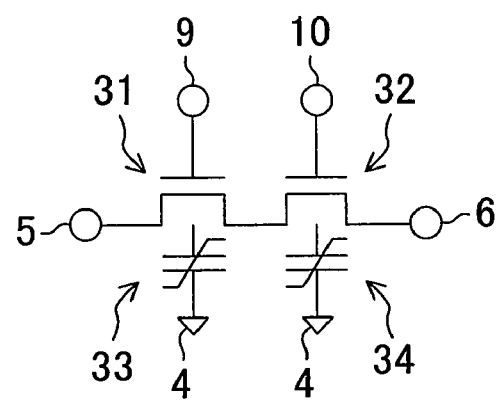
FIG. 2 illustrates an equivalent circuit of the semiconductor memory cell according to the first embodiment of the invention.

FIG. 1 is a cross-sectional view schematically illustrating the configuration of a semiconductor memory cell according to a first embodiment of the present invention, and FIG. 2 illustrates an equivalent circuit thereof.

As shown in FIG. 2, the semiconductor memory cell of this embodiment has a configuration in which a memory element composed of a first field effect transistor (which will be hereinafter referred to as a "first FET") 31 and a selection switch composed of a second field effect transistor (which will be hereinafter referred to as a "second FET") 32 are connected in series.

Also, as shown in FIG. 1, a semiconductor film 4 and a dielectric film 8 stacked over a substrate 1 form a common channel and a common gate insulating film in the first and second FETs 31 and 32. On the dielectric film 8, a first gate electrode 9 of the first FET 31 and a second gate electrode 10 of the second FET 32 are formed. On the semiconductor film 4, a drain electrode 5 is formed outwardly of the first gate electrode 9, a source electrode 6 is formed outwardly of the second gate electrode 10, and an intermediate electrode 7 is formed between the first gate electrode 9 and the second gate electrode 10. Under the semiconductor film 4, a back-gate electrode 2 is formed with a ferroelectric film 3 interposed therebetween, and the ends of the semiconductor film 4 forming the channel are located inwardly of the ends of the back-gate electrode 2.

In the semiconductor memory cell according to this embodiment, the back-gate electrode 2 is formed so as to extend outwardly of the ends of the semiconductor film 4. Thus, when the ferroelectric film 3 and the semiconductor film 4 are stacked over the substrate 1, the smooth semiconductor film 4 can be formed without being affected by a step which would be otherwise formed by the back-gate electrode 2. It is also possible to avoid effects of reaction products generated when the back-gate electrode 2 is etched. This prevents an increase in channel resistance resulting from a step which would be otherwise formed by the semiconductor film 4, and allows the semiconductor memory cell having stable characteristics to be obtained.

In the semiconductor memory cell according to the present invention, the back-gate electrode 2 is formed to extend outwardly of the ends of the semiconductor film 4, whereby the back-gate electrode 2 is inevitably located under the drain electrode 5 and the source electrode 6. As a result, if the configuration of the semiconductor memory cell shown in FIG. 14 is adopted as it is, the selection switch (i.e., the second FET) 32 will not be controllable by the second gate electrode 10 for the following reasons.

To be specific, when binary data, which should be stored as the direction of polarization of the ferroelectric film 3 in the memory element (i.e., the first FET) 31, is rewritten, not only the polarization of the part of the ferroelectric film 3 located in the lower portion of the first FET 31, but also the polarization of part of the ferroelectric film 3 located in the lower portion of the second FET 32 is caused to change. When upward polarization is written into the ferroelectric film 3, a current passes through the selection switch 32 even if a ground potential is applied to the second gate electrode 10 in order to turn the selection switch 32 off.

Figure 14A:
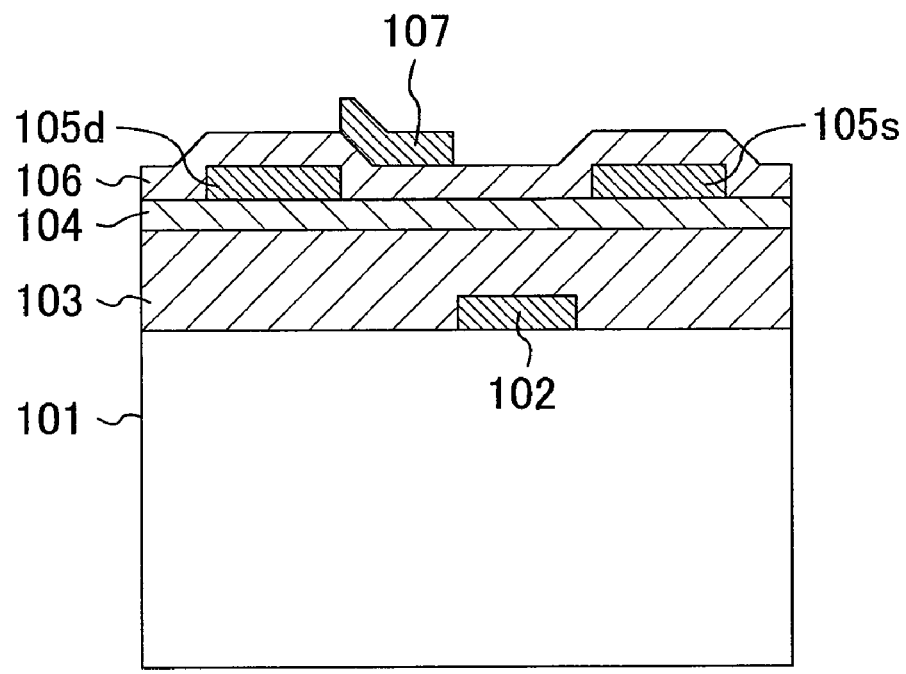
FIGS. 14A and 14B are views for explaining the configuration of a semiconductor memory cell including a MFSFET (a memory element) and a MISFET (a switching element).
Figure 14B:
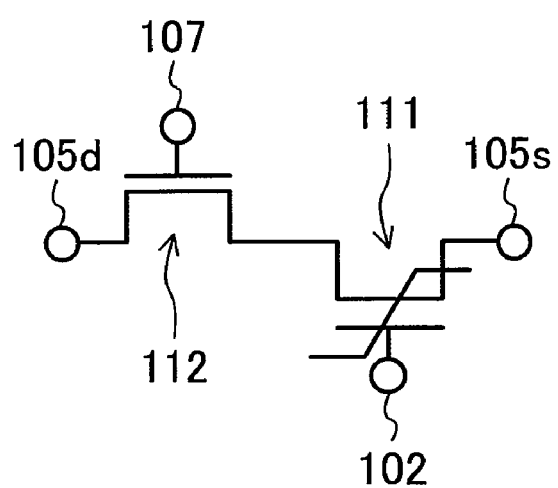

In light of this, in the semiconductor memory cell according to the present invention, the memory element 31 is also provided with the first gate electrode 9 with the dielectric film 8 interposed, and an operation for writing data into the semiconductor memory cell being in a reset state is employed instead of the data rewrite (overwrite) operation adopted in the semiconductor memory cell configuration shown in FIG. 14, thereby enabling a memory operation utilizing channel resistance modulation in the semiconductor film 4. To rewrite data into the memory cell in which data has already been written, a reset operation is first performed, and then the data is written.

First of all, channel resistance modulation in the common channel (i.e., the semiconductor film) 4 in the first and second FETs 31 and 32 will be described below.

The resistance of the channel 4 of the first and second FETs 31 and 32 is controllable by voltages applied to the first and second gate electrodes 9 and 10. Alternatively, the resistance of the channel 4 of the first and second FETs 31 and 32 is also controllable by applying a voltage between the back-gate electrode 2 and the first gate electrode 9, the second gate electrode 10, the drain electrode 5, or the source electrode 6 to thereby control the polarization of the ferroelectric film 3 so that the direction thereof is upward or downward.

For example, in a case in which the n-type semiconductor film 4 is used as the channel, if the direction of the polarization of the ferroelectric film 3 is upward, the concentration of carriers in the n-type semiconductor film 4 is increased, causing the resistance of the channel to be lowered. Since the polarization density is intrinsic to each ferroelectric material, an on-state in which the resistance is extremely low is achievable by choosing a ferroelectric material having a high polarization density.

On the other hand, when the direction of the polarization of the ferroelectric film 3 is downward, the carrier concentration in the n-type semiconductor film 4 is lowered, causing the resistance of the channel to be increased. An off-state in which the resistance is extremely high is achievable by reducing crystal defects and thus the carrier concentration in the n-type semiconductor film 4 and by reducing the thickness of the semiconductor film 4 to thereby reduce the number of carriers per unit area contained in the semiconductor film 4 below the polarization density.

For example, if the polarization density in the ferroelectric film 3 is 30 $\mu C/cm^2$, the carrier concentration in the n-type semiconductor film 4 is $1 \times 10^{15}$ $cm^{-3}$, and the thickness of the n-type semiconductor film 4 is 30 nm, then the number of carriers in the semiconductor film 4 in a neutral state is $4.8 \times 10^{-4}$ $\mu C/cm^2$ (carrier concentration×thickness×elementary electric charge). That is, the number of carriers per unit area is 30 $\mu C/cm^2$ in the on-state, and $4.8 \times 10^{-4}$ $\mu C/cm^2$ or lower in the off-state. Since the channel resistance in the on-state and in the off-state is proportional to the number of carriers, the polarization of the ferroelectric film 3 allows resistance modulation to be increased by about 60,000 times.

In this manner, the resistance of the channel 4 of the first and second FETs 31 and 32 can be modulated by the voltages applied to the first and second gate electrodes 9 and 10 and can also be modulated by the polarization of the ferroelectric film 3. The respective parts of the channel 4 in the first and second FETs 31 and 32 are connected in series, and modulation of these channel resistances can cause changes in the drain-source current (Ids).

For example, when the directions of polarization of the respective parts of the ferroelectric film 3 in the first and second FETs 31 and 32 are both upward, Ids flows even if the voltage (Vg1) applied to the first gate electrode 9 and the voltage (Vg2) applied to the second gate electrode 10 are both 0V. This state is a normally on state. By applying a positive bias to Vg1 and Vg2, Ids can be increased further from the level of Ids obtained in the normally on state.

When the directions of polarization of the respective parts of the ferroelectric film 3 in the first and second FETs 31 and 32 are both downward, Vg1=Vg2=0V, and thus Ids does not flow. This state is a normally off state. If a positive bias is applied to Vg1 and Vg2, Ids will flow.

Furthermore, when one of the parts of the ferroelectric film 3 located in either the first or second FET 31 or 32 has upward polarization, and the other part has downward polarization, then the field effect transistor having the upward polarization is in the normally on state, and the field effect transistor having the downward polarization is in the normally off state. Since the first and second FETs 31 are 32 are connected in series, Vg1=Vg2=0V, and thus Ids does not flow. If a positive bias is applied to the gate electrode of the field effect transistor in the normally off state, Ids will flow.

In this manner, the polarization directions in the ferroelectric film 3 are set at will, thereby enabling the Ids-Vg1 characteristics and the Ids-Vg2 characteristics to be modulated. Since the polarization states in the ferroelectric film 3 remain even after the voltages are removed, the normally on state or the normally off state once set is retained, and when the semiconductor memory cell is activated again, the Ids-Vg1 characteristics and the Ids-Vg2 characteristics are reproduced.

Next, the operation of the semiconductor memory cell of this embodiment in which the above-described channel resistance modulation is utilized will be described.

First, the part of the ferroelectric film 3 located under the first gate electrode 9 is polarized in a first direction, and the part of the ferroelectric film 3 located under the second gate electrode 10 is polarized in a second direction which is opposite to the first direction, thereby resetting the semiconductor memory cell so that the part of the channel 4 located under the first gate electrode 9 has a low resistance and the part of the channel 4 located under the second gate electrode 10 has a high resistance.

To be specific, after the entire ferroelectric film 3 is polarized in the first direction by applying a predetermined voltage to the back-gate electrode 2, and then only the part of the ferroelectric film 3 located under the second gate electrode 10 is polarized in the second direction by applying a predetermined voltage to the second gate electrode 10, thereby performing the reset operation.

The term "entire ferroelectric film" herein means an area which includes at least the parts of the ferroelectric film 3 located under the first and second electrodes 9 and 10, the drain electrode 5, and the source electrode 6.

By this reset operation, the semiconductor memory cell is reset so that the first FET 31 is in the normally on state, and the second FET 32 is in the normally off state. Since the first and second FETs 31 and 32 are connected in series, Ids does not flow in the semiconductor memory cell.

Next, a predetermined voltage is applied to the back-gate electrode 2 and between the first gate electrode 9 and the drain electrode 5 to polarize the part of the ferroelectric film 3 located under the first gate electrode 9 in the second direction that is opposite to the reset state, thereby writing data into the first FET (i.e., the memory element) 31. As a result, the part of the channel 4 located under the first gate electrode 9 changes from the low resistance state (i.e., the reset state) to the high resistance state.

Since the two resistance states (i.e., the low resistance state and the high resistance state) in the part of the channel 4 located under the first gate electrode 9 can be brought into correspondence with binary data, an operation for polarizing the part of the ferroelectric film 3 located under the first gate electrode 9 in the same direction (i.e., the first direction) as the reset state, that is, an operation for maintaining the low resistance state, also corresponds to a write operation.

Specifically, the writing of binary data into the memory element 31 is performed by reversing the polarization of the ferroelectric film 3 to thereby change the channel state from the normally on state set by the reset operation to the normally off state or by maintaining the channel state in the normally on state set by the reset operation. At this time, since the second FET (i.e., the selection switch) 32 remains in the normally off state, Ids does not flow.

In the data write operation, the polarization of the ferroelectric film 3 is reversed by applying, to the ferroelectric film 3, an electric field which is equal to or higher than the coercive electric field thereof, and thus if the selection switch 32 is in the on-state, Ids will flow in an excessive amount. At this time, if hot carriers are generated and these carriers are trapped in the gate insulating film 8, the operation of the memory element may be caused to be unstable. However, during the write operation for writing data into the memory element 31 according to the present invention, Ids does not flow, and hence such a phenomenon does not occur, enabling the memory element to operate stably.

Next, the data written into the memory element 31 is read as follows. A predetermined voltage is applied to the second gate electrode 10 to turn the selection switch 32 on, and a predetermined voltage is applied between the source electrode 6 and the drain electrode 5 to detect a current Ids that flows in accordance with the polarization direction in the part of the ferroelectric film 3 located under the first gate electrode 9, thereby reading the data.

That is, the binary data written into the memory element 31 can be read by making the selection switch 32 in the normally off state to turn on, detecting the magnitude of Ids, and thereby identifying the channel state in the memory element 31.

It should be noted that the voltage that is applied between the source electrode 6 and the drain electrode 5 is preferably equal to lower than the coercive voltage of the ferroelectric film 3.

As described above, in the semiconductor memory cell according to this embodiment, the memory element 31 and the selection switch 32, which are composed of two field effect transistors, are connected in series, and the semiconductor film 4 formed under the gate insulating film 8 is used as the common channel, while functions of the memory cell, such as writing and reading, are performed by controlling the channel resistances of the respective parts of the channel (the semiconductor film) 4 in the field effect transistors by partially controlling the polarization directions in the ferroelectric film 3 provided under the channel 4.

Second Embodiment

In the first embodiment, the basic configuration and operation of the semiconductor memory cell according to the present invention have been described. In this embodiment, a semiconductor memory array in which semiconductor memory cells of the present invention are arranged in an array will be described.

Figure 3:
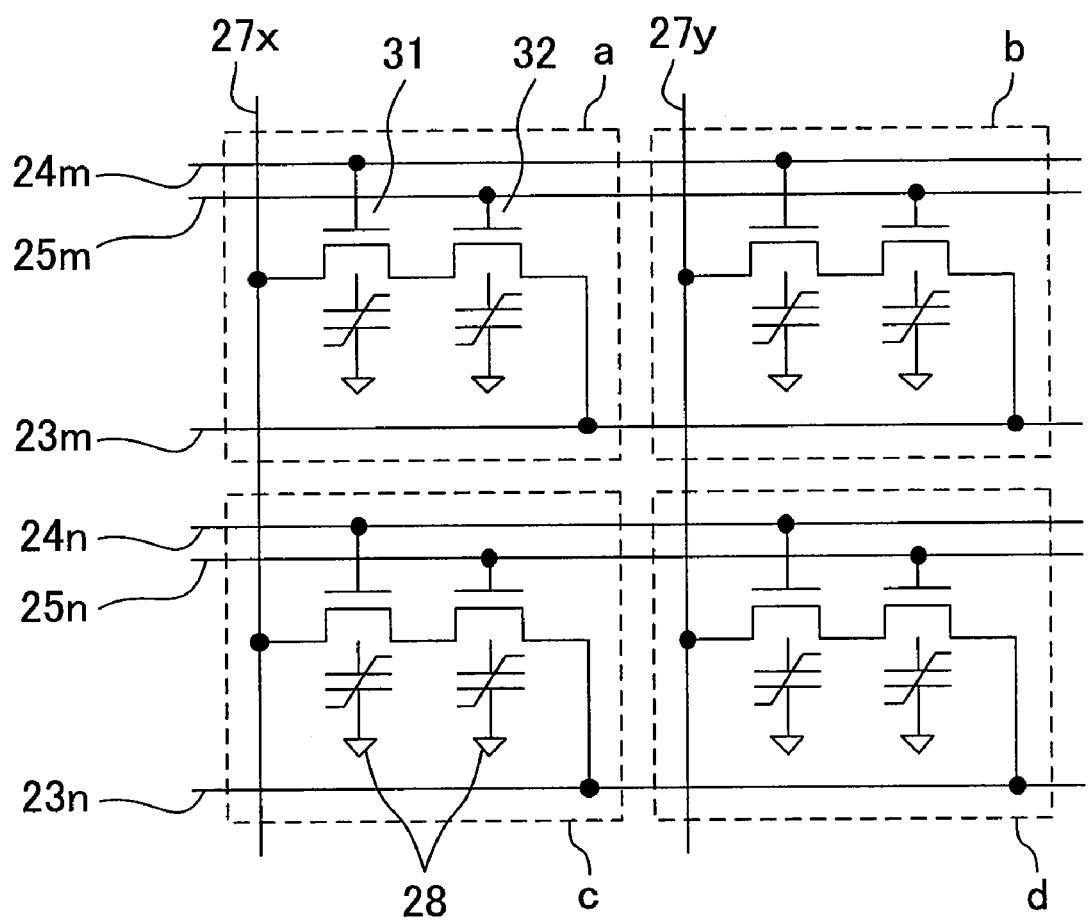
FIG. 3 is a circuit diagram illustrating the configuration of a semiconductor memory array according to a second embodiment of the invention.
Figure 4:
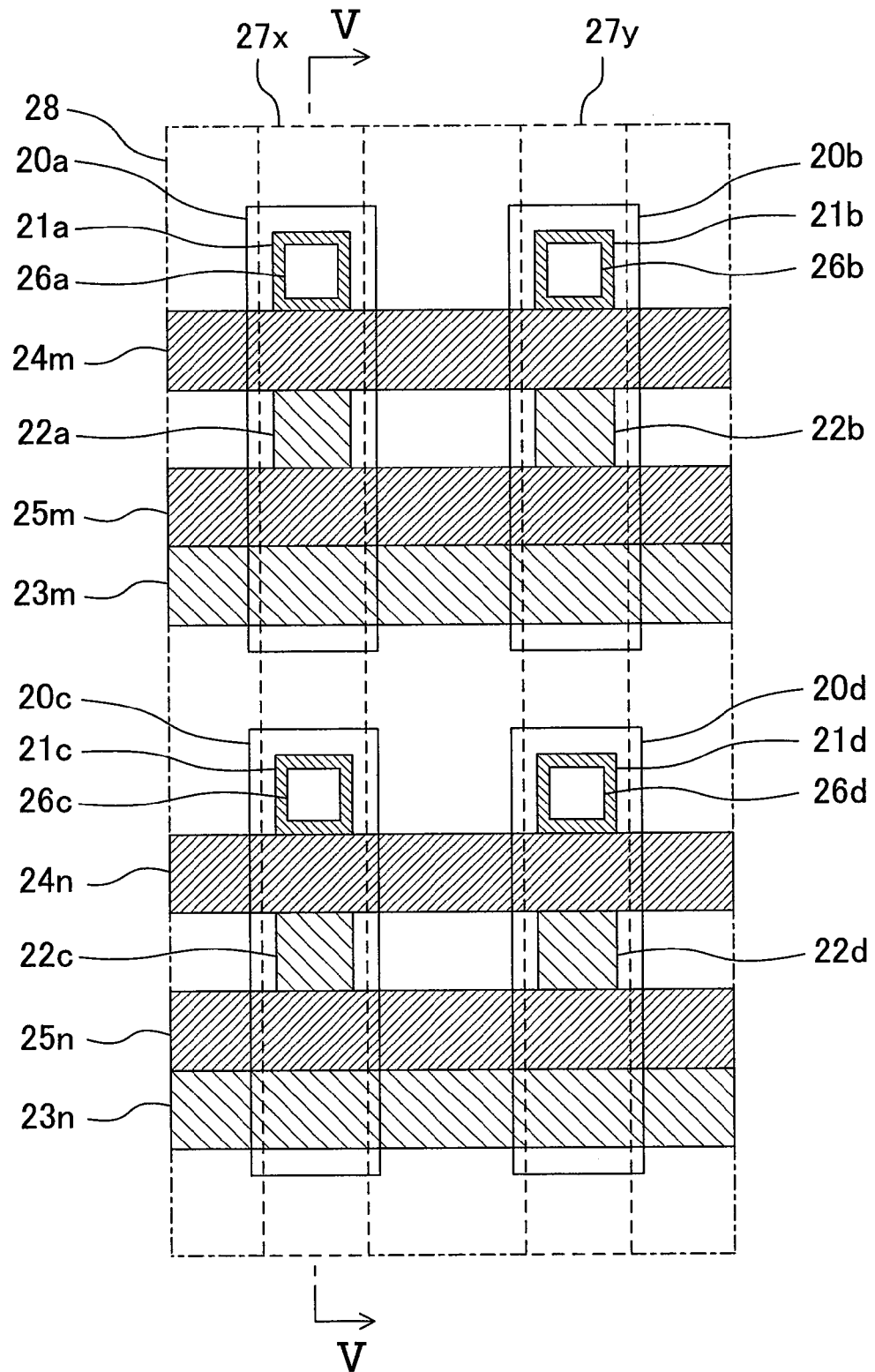
FIG. 4 is a plan view illustrating a layout of the semiconductor memory array according to the second embodiment of the invention.
Figure 5:
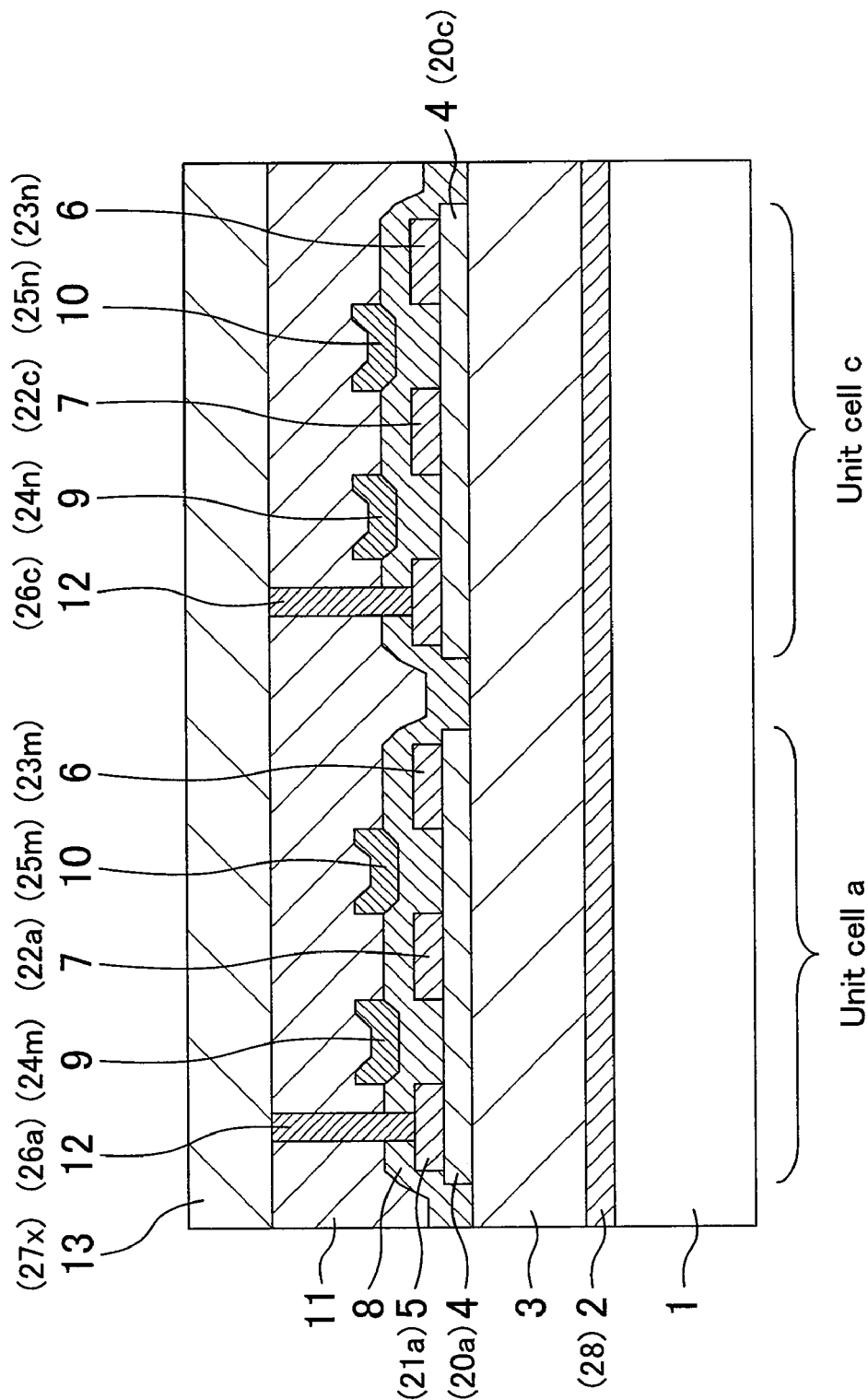
FIG. 5 is a cross-sectional view taken along the line V-V in FIG. 4 and illustrating the configuration of the semiconductor memory array.

FIG. 3 illustrates the circuit configuration of the semiconductor memory array according to this embodiment. FIG. 4 is a plan view illustrating a layout when the semiconductor memory array is formed on a semiconductor substrate. FIG. 5 is a cross-sectional view taken along the line V-V in FIG. 4 and illustrating the configuration of the semiconductor memory array.

In this embodiment, a semiconductor memory array having two rows and two columns will be described by way of example.

As shown in FIG. 3, in semiconductor memory cells (unit cells) a to d, first gate electrodes in each row are connected with a first word line 24$m$ or 24$n$. Second gate electrodes in each row are connected with a second word line 25$m$ or 25$n$. Source electrodes in each row are connected with a source line 23$m$ or 23$n$. Drain electrodes in each column are connected with a bit line 27$x$ or 27$y$. In the drawings, the reference characters m and n that are put after reference numerals correspond to the upper row and the lower row, the reference characters x and y correspond to the left column and the right column, and the reference characters a to d correspond to the respective unit cells.

As shown in FIGS. 4 and 5, the basic configuration of each semiconductor memory cell is the same as that shown in FIG. 1. A back-gate electrode 28 (2) is a common electrode in all of the semiconductor memory cells a to d, and channels 20$a$ to 20$d$ (4) in the semiconductor memory cells a to d are each formed in an island shape inwardly of the back-gate electrode 28 so as to be separate from each other. Drain electrodes 21$a$ to 21$d$ (5) in the semiconductor memory cells a to d are connected with the bit lines 27$x$ and 27$y$ through contact plugs 26$a$ to 26$d$ (12) formed in an interlayer insulating film 11.

The basic operation of the semiconductor memory array of this embodiment is as follows. The detailed operation thereof will be described later.

First, a predetermined voltage is applied to the back-gate electrode 28 to polarize an entire ferroelectric film 3 in all of the semiconductor memory cells a to d in a first direction, and then a predetermined voltage is applied between all of the second word lines 25$m$ and 25$n$ and all of the source lines 23$m$ and 23$n$ so as to polarize only parts of the ferroelectric film 3 located under the second gate electrodes 10 in all of the semiconductor memory cells a to d in the second direction, thereby performing a reset operation.

By this operation, in all of the semiconductor memory cells a to d, the memory elements (the first FETs) 31 are reset to the normally on state and the selection switches (the second FETs) 32 are reset to the normally off state.

In a write operation, a predetermined voltage is applied to the back-gate electrode 28 and to the first word line 24$m$ (or 25$m$) in a selected row, while a predetermined voltage corresponding to data to be written is applied to the bit lines 27$x$ and 27$y$, thereby writing the data into the first FETs 31 in the semiconductor memory cells a and b (or c and d) in the selected row.

In a read operation, a predetermined voltage is applied to the second word line 25$m$ (or 25$n$) in the selected row, and a predetermined voltage is applied to the bit lines 27$x$ and 27$y$ to detect a current flowing through the selected source line 23$m$ (or 23$n$), thereby reading the data written into the semiconductor memory cells a and c (or b and d) in the selected row.

Next, with reference to FIG. 5, the specific configuration of the semiconductor memory array according to this embodiment will be described.

The back-gate electrode 2 made of strontium ruthenate (SrRuO$_3$ which will be hereinafter referred to as "SRO") having a thickness of 20 nm, the ferroelectric film 3 made of lead zirconate titanate (Pb(Zr, Ti)O$_3$ which will be hereinafter referred to as "PZT") having a thickness of 450 nm, and the semiconductor film 4 made of n-type zinc oxide (ZnO) having a thickness of 30 nm are stacked on the (100) surface of a substrate 1 made of monocrystalline strontium titanate (SrTiO$_3$ which will be hereinafter referred to as "c-STO"). Furthermore, on the semiconductor film 4, the drain electrodes 5, the source electrodes 6, and the intermediate electrodes 7, made of titanium (Ti) and having a thickness of 30 nm, are formed. Over these electrodes, the gate insulating film 8 made of silicon nitride (SiN) having a thickness of 50 nm, the first and second gate electrodes 9 and 10 made of platinum (Pt) having a thickness of 60 nm, and the interlayer insulating film 11 made of silicon dioxide (SiO$_2$) are formed. In the interlayer insulating film 11, the contact plugs 12 made of tungsten (W) and connected with the drain electrodes 5 are formed, and the contact plugs 12 are connected with a bit line 13 made of aluminum.

Next, with reference to FIGS. 6A to 7D, a method for fabricating the semiconductor memory array according to this embodiment will be described.

Figure 6A:
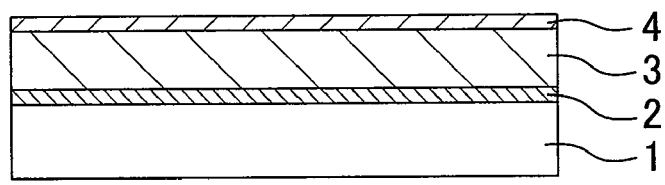
FIGS. 6A to 6D are cross-sectional views illustrating process steps for fabricating the semiconductor memory array according to the second embodiment of the invention.

First, as shown in FIG. 6A, an SRO film 2 having a thickness of 20 nm and a PZT film 3 having a thickness of 450 nm are formed by a pulse laser deposition (PLD) method on a c-STO substrate 1 at a substrate temperature of 700° C., and thereafter, a ZnO film 4 having a thickness of 30 nm is formed at a substrate temperature of 400° C.

The composition of a target used in forming the PZT film 3 is Pb:Zr:Ti=1: 0.52:0.48. At this composition, the lattice mismatch between the c-STO substrate 1 and the SRO and PZT films 2 and 3 is within 3%, and thus the SRO film 2 and the PZT film 3 can be epitaxially grown under the above-described growth conditions.

The surface of the PZT film 3 formed by this method was observed using an atomic force microscope (AFM) and was found to be very smooth with an average square roughness of 3 nm or less. Also, the ZnO film 4 is grown with a c-axis (which is a crystal axis direction in which a spontaneous polarization occurs) oriented in the planar direction of the PZT film 3, and hence a nonpolar surface is oriented on the PZT film 3. That is, the direction of the spontaneous polarization in the ZnO film 4 is perpendicular to the direction of polarization of the PZT film 3 and thus has no effects on carrier modulation in the ZnO film 4 caused by the polarization of the PZT film 3.

Figure 6B:
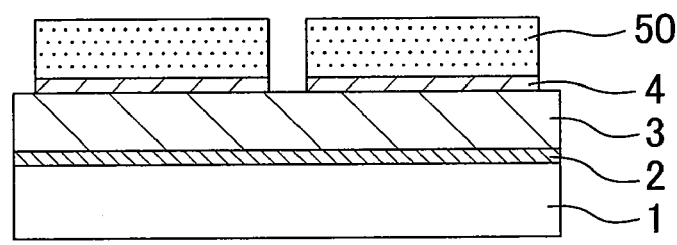

Next, as shown in FIG. 6B, a resist pattern 50 is formed on the ZnO film 4, and, with the resist pattern used as a mask, part of the ZnO film 4 other than active regions is etched using dilute nitric acid, thereby forming the channels 20a to 20d.

Figure 6C:
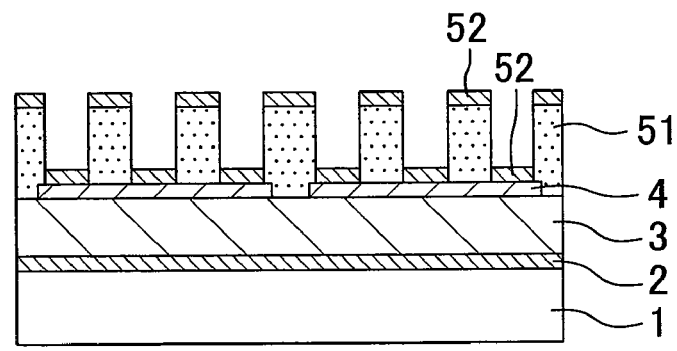

Subsequently, as shown in FIG. 6C, after the resist 50 is removed, a resist pattern 51 is again formed, and then a Ti film 52 having a thickness of 30 nm is deposited by an electron beam vapor deposition method.

Figure 6D:
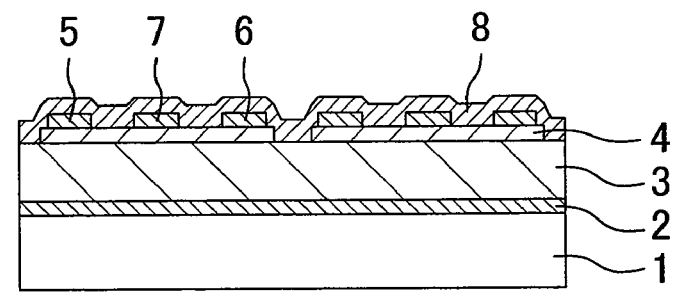

Thereafter, as shown in FIG. 6D, the resist pattern 51 is removed, thereby forming the drain electrodes 5, the source electrodes 6, and the intermediate electrodes 7 on the ZnO film 4. Then, an SiN film 8 is grown over the ZnO film 4 by a sputtering method so as to cover the electrodes 5, 6, and 7.

Figure 7A:
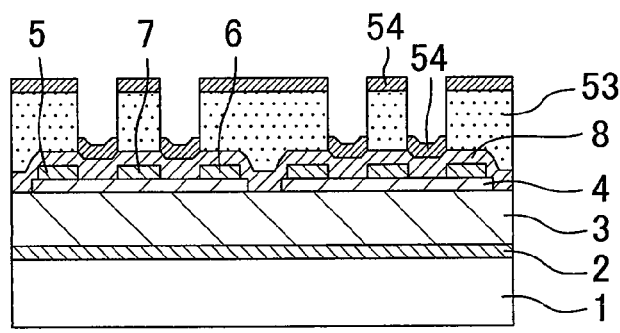
FIGS. 7A to 7D are cross-sectional views illustrating process steps for fabricating the semiconductor memory array according to the second embodiment of the invention.

Next, as shown in FIG. 7A, a resist pattern 53 is formed on the SiN film 8, and then a Pt film 54 having a thickness of 60 nm is deposited by an electron beam vapor deposition method.

Figure 7B:
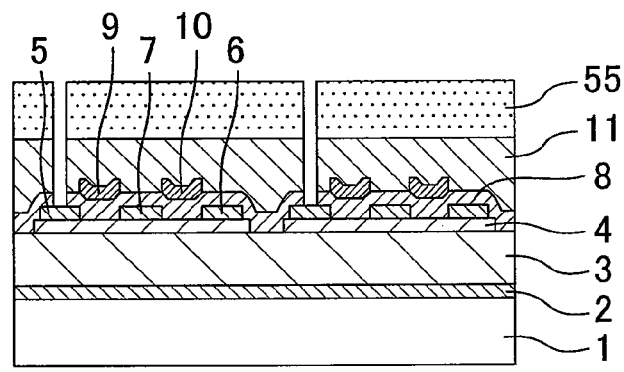

Subsequently, as shown in FIG. 7B, the resist pattern 53 is removed, thereby forming first and second gate electrodes 9 and 10 on the SiN film 8. Thereafter, an $SiO_2$ film 11 is deposited by a plasma CVD method, and then a resist pattern 55 is again formed. Then, the $SiO_2$ film 11 and the SiN film 8 are etched with the resist pattern 55 used as a mask, thereby forming contact holes which reach the surfaces of the drain electrodes 5.

Figure 7C:
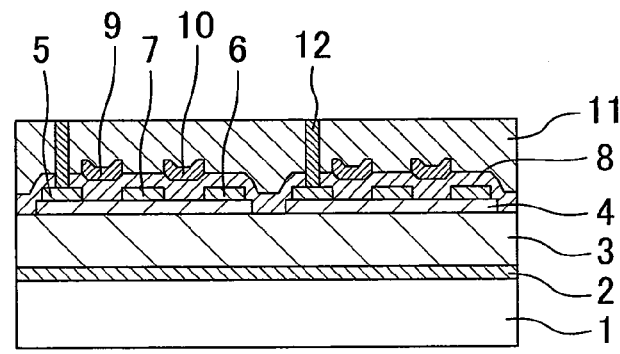

Subsequently, as shown in FIG. 7C, W films are deposited in the contact holes by a blanket CVD method, and then a planarization process is performed by a chemical mechanical polishing (CMP) process, thereby forming contact plugs 12 in the $SiO_2$ film 11.

Figure 7D:
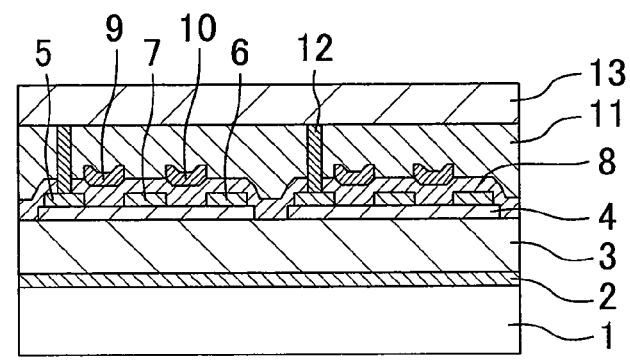

Finally, as shown in FIG. 7D, aluminum (Al) is deposited by a sputtering process and then the deposited aluminum is patterned to form a bit line 13 which is connected to the contact plugs 12.

The polarization characteristics of the PZT film 3 formed by the above-described method were examined. When a voltage (a coercive voltage) of 2V or higher was applied between the upper and lower electrodes, the polarization was reversed, and the polarization density 2Pr obtained when a voltage of ±10 V was applied and then the voltage was brought back to 0V was 60 $\mu C/cm^2$. The carrier concentration in the ZnO film 4 obtained by hole measurement was $8\times10^{17}$ $cm^{-3}$. Since the thickness of the ZnO film 4 is 30 nm, the carrier density per unit area is $2.4\times10^{12}$ $cm^{-2}$. The charge density, which is obtained by multiplying this value by an elementary electric charge of $1.6\times10^{-19}$ C is 0.4 $\mu C/cm^2$, which is smaller than the polarization charge density in the PZT film 3. Therefore, when the direction of the polarization of the PZT film 3 is downward, the carriers in the ZnO film 4 repel this polarization and are thus pushed away, so that the ZnO film 4 is depleted. On the other hand, when the direction of the polarization of the PZT film 3 is upward, carriers at a concentration corresponding to the polarization density are induced at the interface between the ZnO film 4 and the PZT film 3.

Next, the operation of the semiconductor memory array according to this embodiment will be described in detail with reference to the accompanying drawings.

(Reset Operation)

Figure 8A:
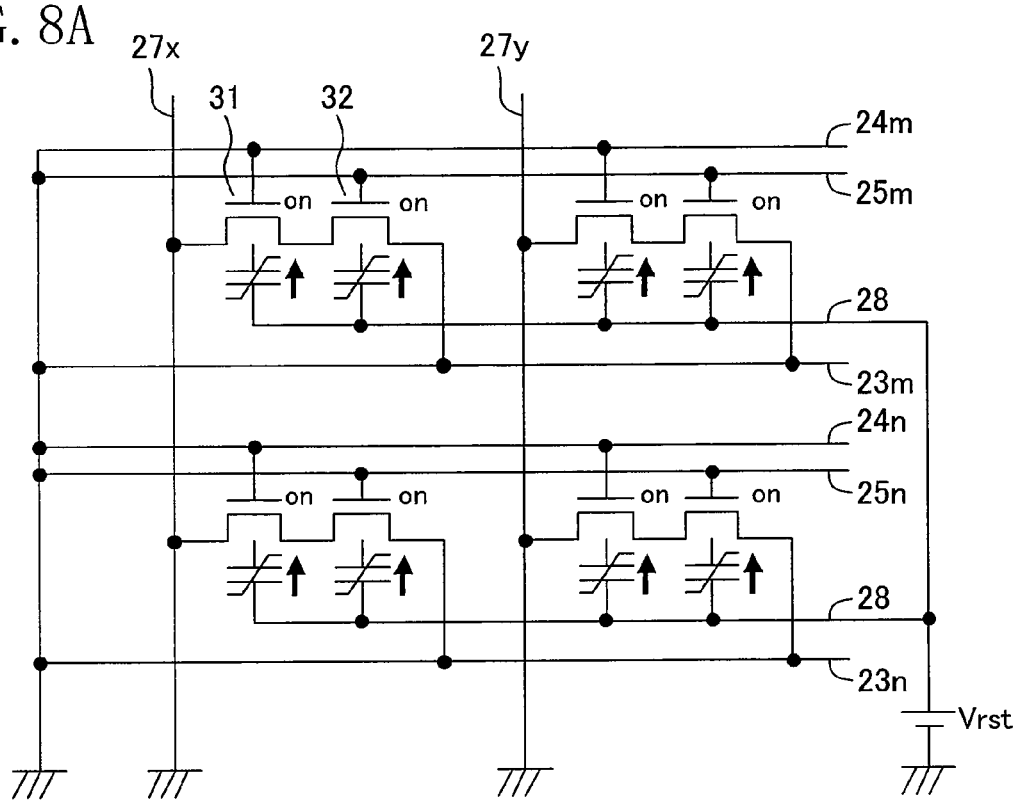
FIGS. 8A and 8B are circuit diagrams for explaining a reset operation in the semiconductor memory array according to the second embodiment of the invention.
Figure 9A:
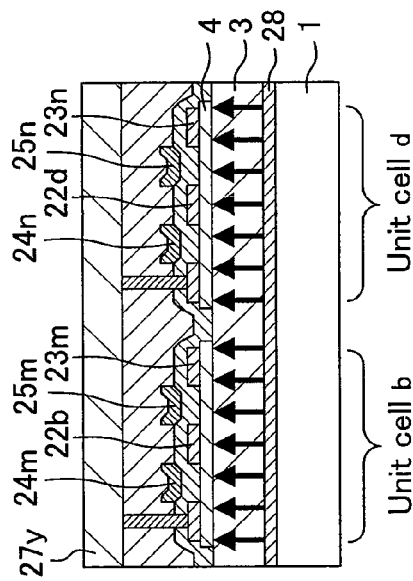
FIGS. 9A and 9B are cross-sectional views for explaining the reset operation in the semiconductor memory array according to the second embodiment of the invention.
Figure 9A:
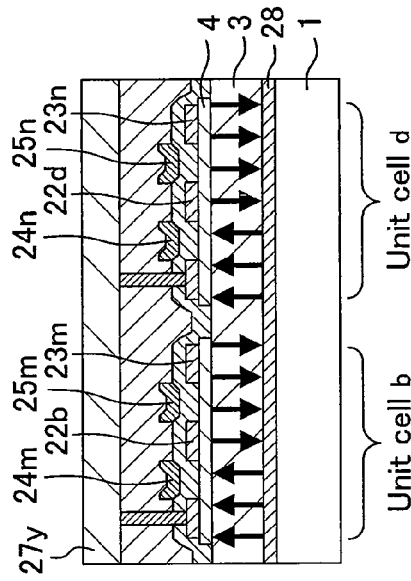

First, as shown in FIG. 8A, the first word lines 24m and 24n, the second word lines 25m and 25n, the source lines 23m and 23n, and the bit lines 27x and 27y are all grounded, and a reset voltage Vrst (typically 10 V) is applied to the back-gate electrode 28. At this time, as shown in FIG. 9A, a voltage equal to or higher than the coercive voltage is applied from the back-gate electrode 28 to the ZnO film 4, so that the polarization in the PZT film 3 in all of the semiconductor memory cells (the unit cells) a to d is oriented in an upward direction.

Figure 8B:
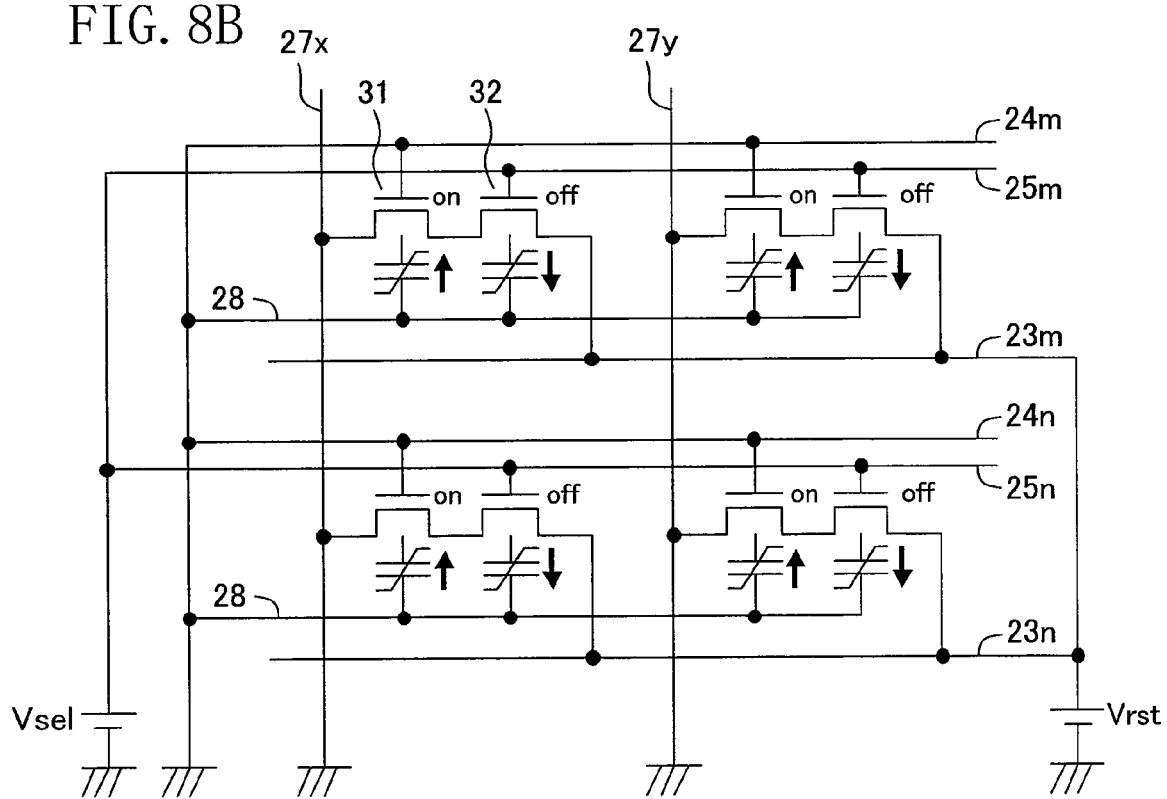
Figure 9B:
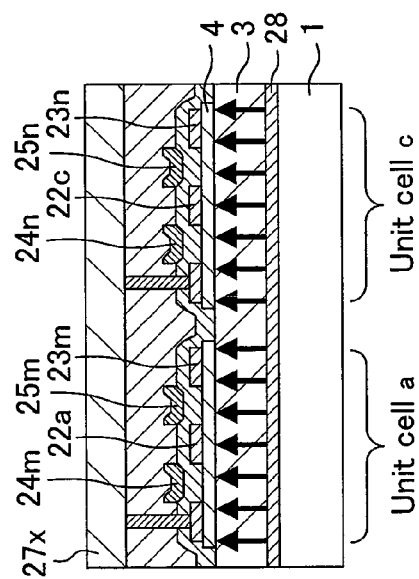
Figure 9B:
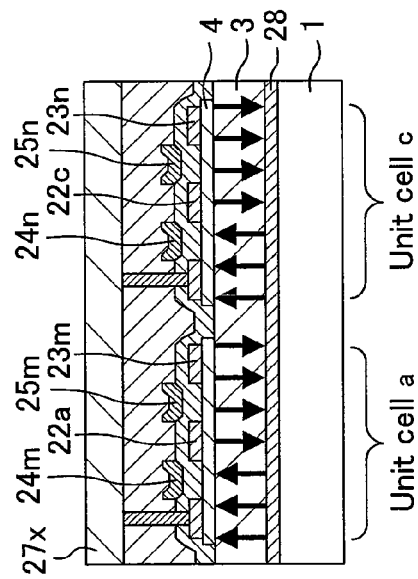

Next, as shown in FIG. 8B, the first word lines 24m and 24n, the bit lines 27x and 27y, and the back-gate electrode 28 are all grounded, and a selection voltage Vsel (typically 15 V) is applied to both of the second word lines 25m and 25n, while the reset voltage Vrst is applied to both of the source lines 23m and 23n. At this time, in each of the semiconductor memory cells a to d, the selection switch 32 is turned on, and the resistance between the source electrode 6 and the intermediate electrode 7 is lowered, causing the potential of a part of the ZnO film 4 in this area to be Vrst. At this time, as shown in FIG. 9B, a voltage exceeding the coercive voltage is applied, in the downward direction, to parts of the ferroelectric film 3 located in the lower portions of the selection switches 32, causing the polarization of those parts of the PZT film 3 to be oriented in the downward direction.

As a result of the foregoing reset operation, in all of the semiconductor memory cells a to d, the polarization of the parts of the ferroelectric film 3 located in the lower portions of the memory elements 31 is oriented in the upward direction, and the memory elements 31 are turned on. On the other hand, in all of the semiconductor memory cells a to d, the polarization of the parts of the ferroelectric film 3 located in the lower portions of the selection switches 32 is oriented in the downward direction, and the selection switches 32 are turned off.

(Write Operation)

A case in which data "1" and data "0" are written into the semiconductor memory cells a and b in the m-th row (which is a selected row) will be described by way of example.

Figure 10A:
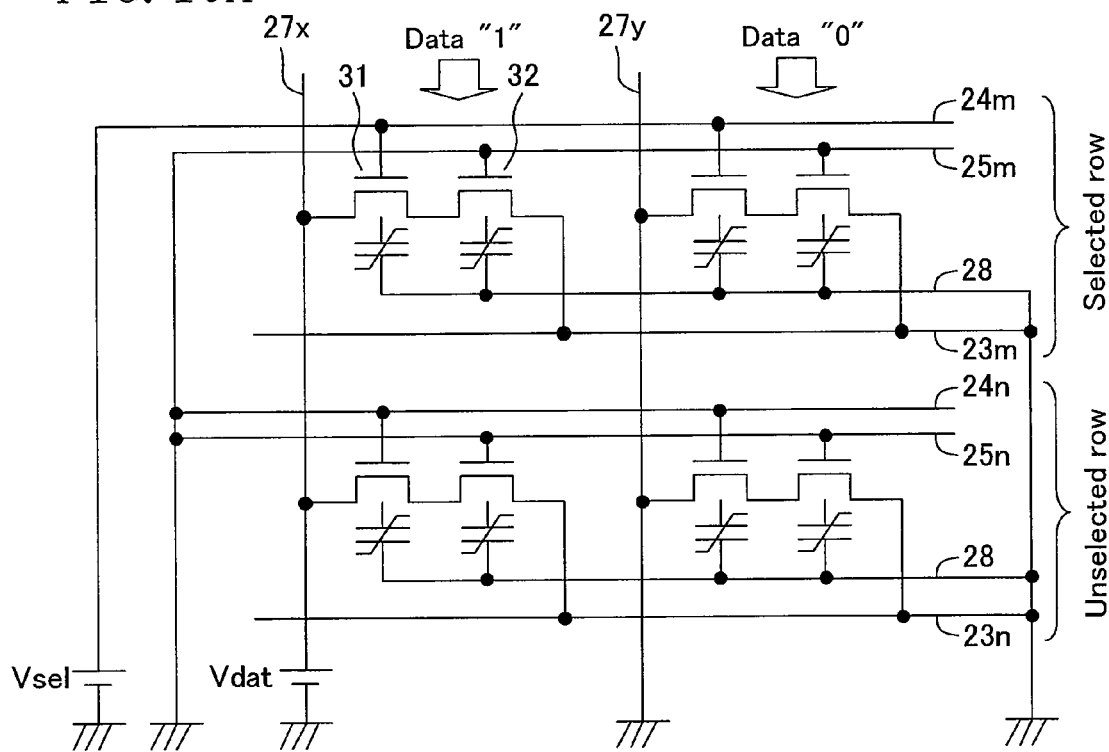
FIGS. 10A and 10B are circuit diagrams for explaining a write operation in the semiconductor memory array according to the second embodiment of the invention.

As shown in FIG. 10A, first, the first word line 24m in the m-th row, the second word lines 25m and 25n in the n-th row (which is an unselected row), the source lines 23m and 23n, and the back-gate electrode 28 are grounded, and Vsel is applied to the first word line 24m in the m-th row. A data voltage Vdat (typically 10 V) is applied to the bit line 27x with which the semiconductor memory cell a, into which the data "1" is to be written, is connected, while 0 V is applied to the bit line 27y with which the semiconductor memory cell b, into which the data "0" is to be written, is connected. At this time, since the memory elements 31a and 31b in the semiconductor memory cells a and b are turned on to thereby make the electrical continuity between the drain electrodes 21a and 21b and the intermediate electrodes 22a and 22b, the potential of the parts of the ZnO film 4 in these areas is equal to the bit line potential. That is, in the semiconductor memory cell a, into which the data "1" is written, the voltage Vdat higher than the coercive voltage is applied, in the downward direction, to the part of the ferroelectric film 3 located in the lower portion of the memory element 31, so that the polarization thereof is oriented in the downward direction as shown in FIG. 11A. On the other hand, in the semiconductor memory cell b into which the data "0" is written, no voltage is applied to the part of the ferroelectric film located in the lower portion of the memory element 31, and thus, as shown in FIG. 11A, the polarization thereof remains in the upward direction as set in the reset state shown in FIG. 9B.

Now, the polarization state in the ferroelectric film 3 in the unselected n-th row will be discussed. In the semiconductor memory cell c that is connected to the bit line 27x to which Vdat is applied, since Vdat higher than the coercive voltage is applied to a part (i.e., a region indicated by arrows A in FIG. 11A) of the ferroelectric film 3 located under the drain electrode 21c, a phenomenon in which the polarization is reversed from the reset state occurs (such a phenomenon will be hereinafter referred to as a "disturbance in write operation").

To return the polarization of that part of the ferroelectric film 3 in which the disturbance has occurred to the reset state, after the data has been written into the semiconductor memory cell by the polarization in the direction opposite to the reset state, a voltage having the same magnitude as and the opposite polarization to the write voltage is applied to the bit line connected to that semiconductor memory cell.

Figure 10B:
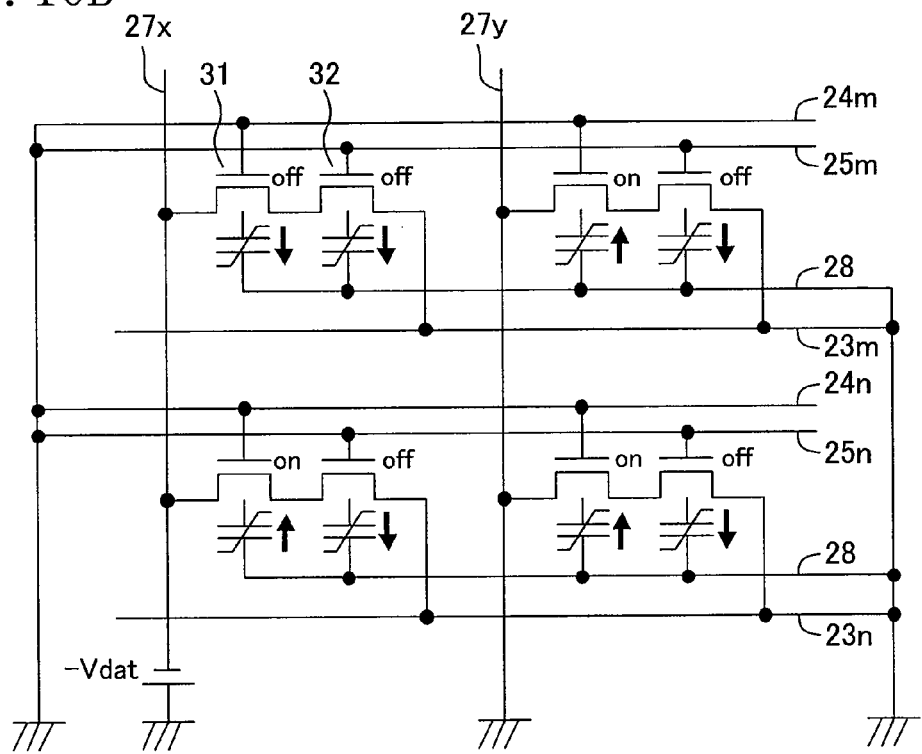

To be specific, as shown in FIG. 10B, the first word lines 24m and 24n, the second word lines 25m and 25n, the source lines 23m and 23n, the back-gate electrode 28, and the bit line 27y to which the data "0" has been written are grounded, and —Vdat is applied to the bit line 27x to which the data "1" has been written. By this operation, Vdat exceeding the coercive voltage is applied, in the upward direction, to the part of the ferroelectric film 3 located under the drain electrode 21c in the semiconductor memory cell c in which the disturbance has occurred, whereby the polarization of the part of the ferroelectric film 3 having the disturbance therein is oriented in the upward direction as in the reset state, as shown in FIG. 11B.

(Read Operation)

A case in which data is read from the semiconductor memory cells a and b in the m-th row (a selected row), into which data "1" and data "0", respectively, have been written, will be described by way of example.

Figure 12:
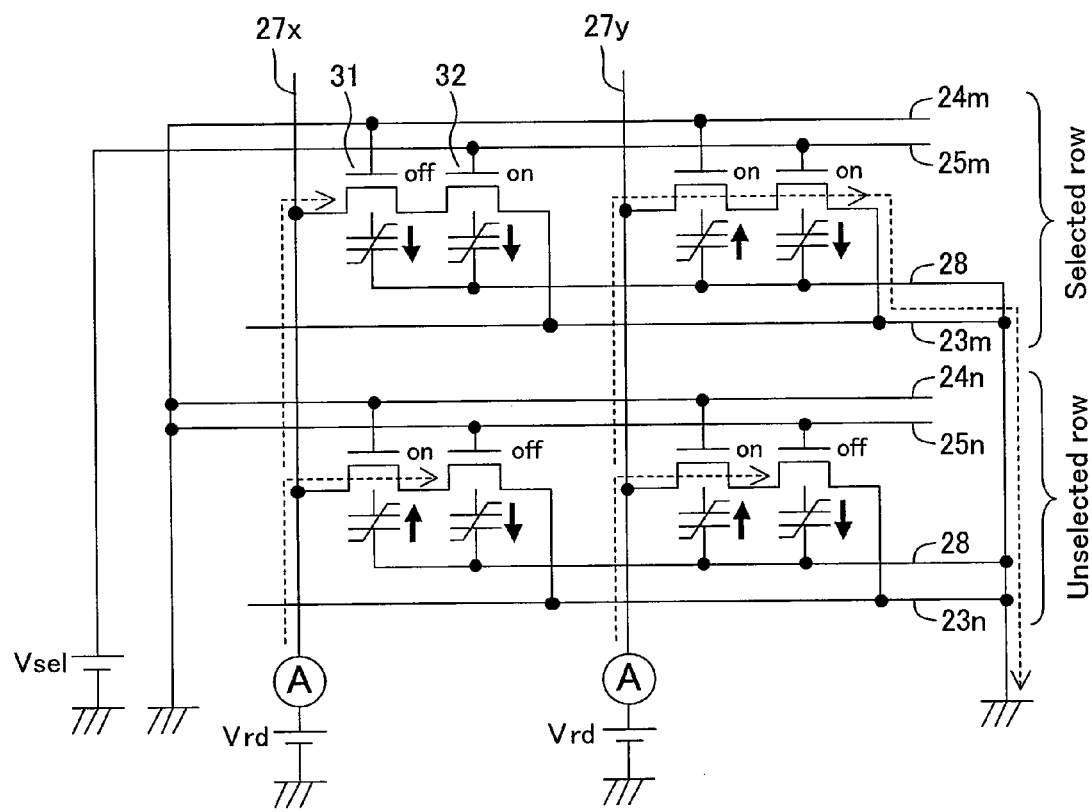
FIG. 12 is a circuit diagram for explaining a read operation in the semiconductor memory array according to the second embodiment of the invention.

As shown in FIG. 12, the first word lines 24m and 24n, the second word line 25n in the n-th row (which is an unselected row), the source lines 23m and 23n, and the back-gate electrode 28 are grounded, Vsel is applied to the second word line 25m in the m-th row, and a read voltage Vrd (typically 0.1 V) is applied to the bit lines 27x and 27y.

At this time, the selection switches 32a and 32b in the semiconductor memory cells a and b are turned on, thereby making the electrical continuity between the source electrode 23m and the intermediate electrodes 22a and 22b. Since the data "1" has been written into the semiconductor memory cell a, the memory element 31a connected in series with the selection switch 32a is in the off state. Hence, in spite of the application of Vrd between the bit line 27x and the source electrode 23m, no current flows.

On the other hand, since the data "0" has been written into the semiconductor memory cell b, the memory element 31b connected in series with the selection switch 32b is in the on state. Hence, Vrd applied between the bit line 27x and the source electrode 23m causes a current to flow.

It is therefore possible to read the stored data by identifying the bit in which no current flows as the data "1" and the bit in which a current flows as the data "0". During the read operation, the selection switches 32c and 32d in the unselected n-th row are in the off state, and thus no current flows in these semiconductor memory cells c and d, allowing reading of the data stored only in the selected row.

Figure 13:
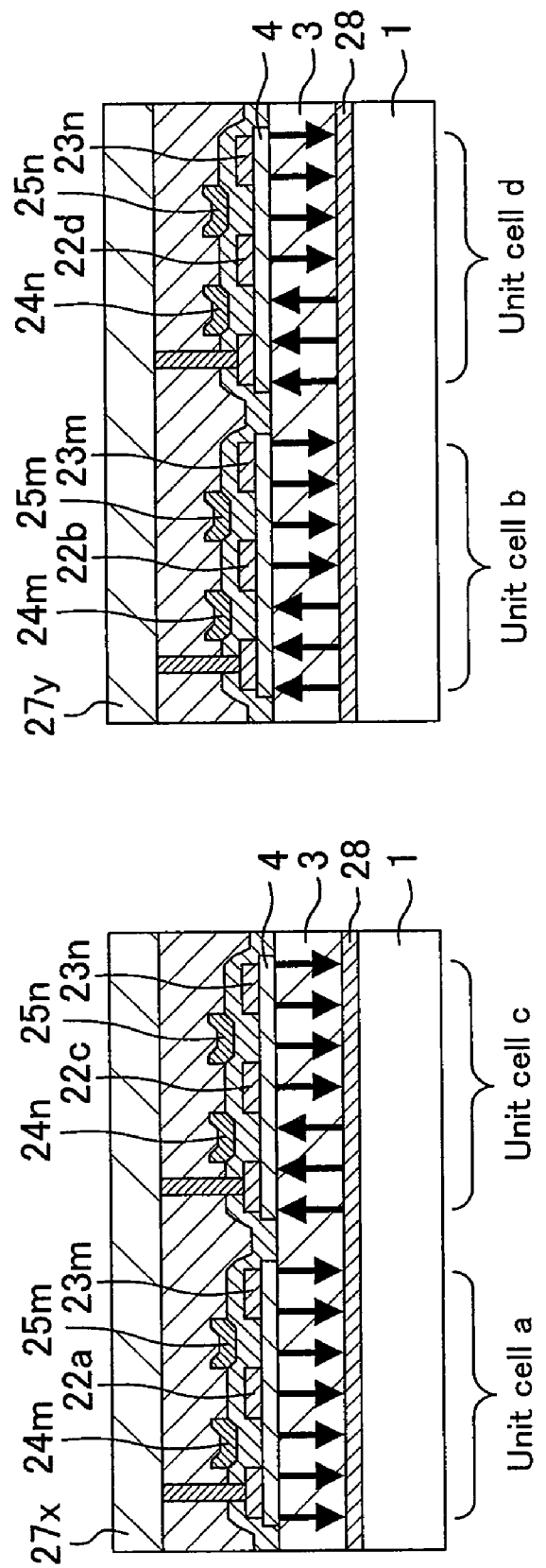
FIG. 13 is a cross-sectional view for explaining the read operation in the semiconductor memory array according to the second embodiment of the invention.

After the read operation, Vsel and Vrd are removed. Also, Vrd that is applied in the read operation is lower than the coercive voltage, preferably about one tenth of the coercive voltage, whereby the polarization state (shown in FIG. 11B) before the read operation is maintained after the read operation as shown in FIG. 13. That is, it is possible to perform non-destructive reading. The ferroelectric film 3 is known to have a fatigue phenomenon, in which due to repetitions of polarization reversal, the value of polarization is decreased. Nevertheless, such fatigue can be suppressed by achieving non-destructive reading.

Although the present invention has been described thus far with reference to the preferred embodiments thereof, the present invention is not limited to the foregoing descriptions, and various changes and modifications can be made thereto. For example, in the above-described embodiments, a PZT film is used for the ferroelectric film 3, however, $SrBi_2Ta_2O_9$, $Bi_{4-x}La_xTi_3O_{12}$, or the like, for example, may be used. Also, although a ZnO film is used for the semiconductor layer 4 forming the channels, the following material may also be used: for example, an oxide semiconductor which contains a transparent material, a superconducting material, or a material undergoing Mott transition, such as $WO_3$, ITO (InO—SnO), IGZO ($InGaO_3(ZnO)_5$), STO, LSCO($La_{2-x}Sr_xCuO_4$), LCMO ($La_{1-x}Ca_xMnO_3$), or PCMO ($Pr_{1-x}Ca_xMnO_3$); a nitride semiconductor, such as indium nitride (InN) or gallium nitride (GaN); or a group IV semiconductor, such as polysilicon or amorphous silicon. Furthermore, an STO substrate is used for the substrate 1, however, for example, a silicon substrate having an insulating film formed thereon may be used, or a substrate made of sapphire or lanthanum aluminum ($LaAlO_3$) may be used. Moreover, although an SiN film is used for the gate insulating film 8, a ZnO film ($Mg_xZn_{1-x}O$) to which magnesium has been added, an aluminum nitride (AlN) film, an aluminum oxide ($Al_2O_3$) film, or the like, for example, may be used. Also, for the electrodes, ITO, ZiTO (Zn—In—Sn—O) or the like may be used.

What is claimed is:

1. A semiconductor memory cell comprising a memory element including a first field effect transistor and a selection switch including a second field effect transistor, the memory element and the selection switch being connected in series,
    wherein a semiconductor film and a dielectric film stacked over a substrate form a common channel and a common gate insulating film in the first field effect transistor and the second field effect transistor;
    a first gate electrode of the first field effect transistor and a second gate electrode of the second field effect transistor are formed on the dielectric film;
    on the semiconductor film, a drain electrode is formed outwardly of the first gate electrode, and a source electrode is formed outwardly of the second gate electrode;
    under the semiconductor film, a back-gate electrode is formed with a ferroelectric film interposed therebetween; and
    ends of the semiconductor film that forms the channel are located inwardly of ends of the back-gate electrode.

2. The semiconductor memory cell of claim 1, wherein a part of the ferroelectric film located under the first gate electrode is polarized in a first direction, and
    a part of the ferroelectric film located under the second gate electrode is polarized in a second direction which is opposite to the first direction,
    thereby resetting the semiconductor memory cell so that a part of the channel located under the first gate electrode has a low resistance and a part of the channel located under the second gate electrode has a high resistance.

3. The semiconductor memory cell of claim 2, wherein a predetermined voltage is applied to the back-gate electrode to polarize the entire ferroelectric film in the first direction, and then a predetermined voltage is applied to the second gate electrode to polarize only the part of the ferroelectric film located under the second gate electrode in the second direction, thereby performing a reset of the semiconductor memory cell.

4. The semiconductor memory cell of claim 2, wherein when the semiconductor memory cell is in a reset state, the first field effect transistor is in a normally on state, and the second field effect transistor is in a normally off state.

5. The semiconductor memory cell of claim 2, wherein a predetermined voltage is applied to the back-gate electrode and between the first gate electrode and the drain electrode to polarize a part of the ferroelectric film located under the first gate electrode in the second direction which is opposite to a reset state, thereby writing data into the first field effect transistor.

6. The semiconductor memory cell of claim 1, wherein a predetermined voltage is applied to the second gate electrode to turn the second field effect transistor on, and
a predetermined voltage is applied between the source electrode and the drain electrode to detect a current that flows in accordance with a polarization direction in a part of the ferroelectric film located under the first gate electrode, thereby reading data written into the first field effect transistor.

7. The semiconductor memory cell of claim 6, wherein the voltage applied between the source electrode and the drain electrode is set so that a voltage applied to the ferroelectric film is equal to or lower than a coercive voltage of the ferroelectric film.

8. A semiconductor memory array, in which a plurality of the semiconductor memory cells of claim 1 are arranged in an array including rows and columns,
wherein in the semiconductor memory cells,
the first gate electrodes in each row are connected to a corresponding one of first word lines,
the second gate electrodes in each row are connected to a corresponding one of second word lines,
the source electrodes in each row are connected to a corresponding one of source lines,
the drain electrodes in each column are connected to a corresponding one of bit lines, and
the back-gate electrode is a common electrode in all of the semiconductor memory cells.

9. The semiconductor memory array of claim 8, wherein a predetermined voltage is applied to the back-gate electrode to polarize, in a first direction, the entire ferroelectric film in all of the semiconductor memory cells, and then a predetermined voltage is applied between all of the second word lines and all of the source lines to polarize, in a second direction, only parts of the ferroelectric film located under the second gate electrodes in all of the semiconductor memory cells, thereby performing a reset operation.

10. The semiconductor memory array of claim 8, wherein a predetermined voltage is applied between the back-gate electrode and the first word line in a selected row, and a predetermined voltage corresponding to data to be written is applied to each bit line, thereby writing the data into the first field effect transistor in each semiconductor memory cell in the selected row.

11. The semiconductor memory array of claim 10, wherein after the data is written into a semiconductor memory cell, in which polarization direction of a part of the ferroelectric film located under the first gate electrode is opposite to that in a reset state, a voltage having the same magnitude as and opposite polarization to a write voltage is applied to the bit line connected to that semiconductor memory cell.

12. The semiconductor memory array of claim 8, wherein a predetermined voltage is applied to the second word line in a selected row, and a predetermined voltage is applied to each bit line to detect a current that flows in the source line in the selected row, thereby reading data written into each semiconductor memory cell in the selected row.

* * * * *